United States Patent
Li

(10) Patent No.: US 10,359,712 B2
(45) Date of Patent: Jul. 23, 2019

(54) RELATIVE POSITION MEASUREMENT BASED ALIGNMENT SYSTEM, DOUBLE WORKPIECE STAGE SYSTEM AND MEASUREMENT SYSTEM

(71) Applicant: SHANGHAI MICRO ELECTRONICS EQUIPMENT (GROUP) CO., LTD., Shanghai (CN)

(72) Inventor: Yunfeng Li, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/756,272

(22) PCT Filed: Aug. 26, 2016

(86) PCT No.: PCT/CN2016/096931
§ 371 (c)(1),
(2) Date: Feb. 28, 2018

(87) PCT Pub. No.: WO2017/036360
PCT Pub. Date: Mar. 9, 2017

(65) Prior Publication Data
US 2018/0253020 A1      Sep. 6, 2018

(30) Foreign Application Priority Data

Aug. 31, 2015  (CN) .......................... 2015 1 0551168

(51) Int. Cl.
*G03F 9/00* (2006.01)
*G03F 7/20* (2006.01)
*H01L 21/68* (2006.01)

(52) U.S. Cl.
CPC ............ *G03F 9/7084* (2013.01); *G03F 7/709* (2013.01); *G03F 7/70716* (2013.01); *G03F 9/00* (2013.01);
(Continued)

(58) Field of Classification Search
CPC .... G03F 9/7084; G03F 7/70716; G03F 7/709; G03F 9/00; G03F 9/7007
See application file for complete search history.

(56) References Cited

U.S. PATENT DOCUMENTS 5,440,397 A       8/1995   Ono
6,495,847 B1 *   12/2002   Asano ................ G03F 7/70716
                                                                  250/548
(Continued)

FOREIGN PATENT DOCUMENTS

CN        101487992 A      7/2009
CN        102096347 A      6/2011
(Continued)

*Primary Examiner* — Zandra V Smith
*Assistant Examiner* — Andre C Stevenson
(74) *Attorney, Agent, or Firm* — Muncy, Geissler, Olds & Lowe, P.C.

(57) ABSTRACT

An alignment system, a dual-wafer-stage system and a measurement system are disclosed, the alignment system including a main frame (201, 301), a first wafer stage (205, 305), an alignment sensor (202, 302), a position acquisition module (208, 308) and a signal processing device (203, 303). The position acquisition module (208, 308) collects positional data from the first wafer stage (205, 305) and the reflector (204, 304) simultaneously. The reflector (204, 304) is arranged on the alignment sensor (202, 302). In other words, positional data of the alignment sensor (202, 302) and positional data of the first wafer stage (205, 305) are collected simultaneously. In addition, the data can be processed to indicate the relative position of the first wafer stage (205, 305) relative to the alignment sensor (202, 302) whose vibration has been zeroed. That is, a position where an alignment mark is aligned can be obtained with the relative vibration amplitude of the alignment sensor (202, 302) being zeroed. This can circumvent the impact of vibration of the alignment sensor (202, 302) and allow increased repeatability accuracy of alignment.

17 Claims, 3 Drawing Sheets

(52) U.S. Cl.
CPC .......... *G03F 9/7007* (2013.01); *G03F 9/7088* (2013.01); *H01L 21/682* (2013.01); *G03F 9/7026* (2013.01); *G03F 9/7034* (2013.01)

(56) References Cited

U.S. PATENT DOCUMENTS

| | | | |
|---|---|---|---|
| 10,162,274 B2* | 12/2018 | Shibazaki | ............ G03F 7/70516 |
| 2002/0063856 A1* | 5/2002 | Inoue | .................... G03B 27/42 |
| | | | 355/53 |
| 2004/0174510 A1 | 9/2004 | Kataoka | |
| 2012/0202301 A1 | 8/2012 | Yaegashi | |
| 2013/0342827 A1 | 12/2013 | Ummethala et al. | |

FOREIGN PATENT DOCUMENTS

| | | | |
|---|---|---|---|
| CN | 102289153 | A | 12/2011 |
| CN | 102375352 | A | 3/2012 |
| CN | 103116250 | A | 5/2013 |
| CN | 103197506 | A | 7/2013 |
| JP | 2001126981 | A | 5/2001 |
| JP | 4893249 | B2 | 3/2012 |
| TW | 201118513 | A | 6/2011 |
| TW | 201520704 | A | 6/2015 |
| WO | WO9840791 | A1 | 9/1998 |

* cited by examiner

RELATIVE POSITION MEASUREMENT BASED ALIGNMENT SYSTEM, DOUBLE WORKPIECE STAGE SYSTEM AND MEASUREMENT SYSTEM

TECHNICAL FIELD

The present invention relates to the fabrication of integrated circuits (ICs) and, in particular, to an alignment system, a dual-wafer-stage system and a measurement system, which are based on relative position measurement.

BACKGROUND

During the manufacturing of semiconductor ICs, a chip is completed typically after a series of photolithographic exposure processes. In order to ensure correct relative positioning between patterns for different IC layers, the exposure for each layer other than the first layer is preceded by a precision positioning process for aligning the pattern for the current layer with the previously exposed one. Relative positioning errors between the patterns are known as overlay errors. Generally, permissible overlay errors are required to be within one third to one fifth of the resolution of a photolithography tool. For example, a photolithography tool with a resolution of 100 nm is required to produce overlay errors smaller than 35 nm. Overlay error performance is an important measure for the quality of a projection photolithography tool and is greatly determined by its mask-to-wafer alignment accuracy. Smaller characteristic dimensions (CDs) tend to impose higher requirements on overlay error performance and hence on alignment accuracy. For example, a CD of 90 nm requires alignment accuracy of 10 nm or below.

FIG. 1 shows a dual-wafer-stage system employed by a step-and-scan photolithography tool for a higher throughout. The system includes: a main frame 101; a projection objective 102 and an alignment sensor 103, both attached to the main frame 101; a wafer stage 104 under exposure corresponding to the projection objective 102; and a wafer stage 105 under measurement corresponding to the alignment sensor 103. A wafer 107 under measurement is placed on the wafer stage 105, and a wafer 106 under exposure is positioned on the wafer stage 104. The wafer stage 105 is configured for measurement of the wafer, including measurements for alignment, leveling and focusing, etc., and the wafer stage 104 is adapted primarily for pattern exposure. They work in parallel and interchangeably, which can lead to a great improvement in throughout.

The employment of such a dual-stage arrangement in the dual-wafer-stage system, however, may augment the vibration of the main frame 101 and hence of the alignment sensor 103 transferred from the projection objective 102. Moreover, the increased throughput requires greater accelerations and thus greater impacts of the wafer stages, which can make a further contribution to the augmentation of the vibration of the alignment sensor 103. As a result of the augmented vibration of the alignment sensor 103, greater alignment errors may occur in the alignment mark measurement.

Furthermore, the requirements on the repeatability accuracy of alignment increase with those on the overlay accuracy of the photolithography tool. Since the vibration of the alignment sensor 103 can directly introduces alignment errors, tolerance of the alignment sensor 103 on such alignment errors will be increasingly low A repeatability accuracy of alignment of up to 2 nm requires vibration amplitude of the alignment sensor 103 of 10 nm (which will lead to an alignment error of about 0.3 nm) or less. As it is difficult to control the vibration amplitude of the alignment sensor in the dual-wafer-stage system within 10 nm, there is a problem of insufficient repeatability accuracy of alignment.

SUMMARY OF THE INVENTION

It is just an objective of the present invention to provide an alignment system based on relative position measurement which can address the above problem of insufficient alignment repeatability.

To this end, the present invention provides an alignment system, a dual-wafer-stage system and a measurement system, the alignment system including: a main frame; a first wafer stage configured to carry a wafer, the wafer including an alignment mark; an alignment sensor attached to the main frame and arranged above the alignment sensor, the alignment sensor being configured to output an optical signal; a position acquisition module, configured to collect a relative positional data of the first wafer stage with respect to the alignment sensor and output the relative positional data of the first wafer stage; and a signal processing device, configured to receive and process the optical signal from the alignment sensor and the relative positional data and to calculate a position for alignment of the alignment mark of the wafer.

Preferably, in the alignment system, the alignment sensor may include an illumination module configured to provide an ultraviolet light or an extreme ultraviolet light for illuminating the alignment mark for alignment.

Preferably, in the alignment system, the alignment sensor may further include an optoelectronic detector configured to detect and receive reflected and diffracted light beams from the alignment mark and output the optical signal.

Preferably, in the alignment system, the position acquisition module may include a light source module configured to provide visible light.

Preferably, in the alignment system, the light source module may be configured to emanate a first visible light beam to the alignment sensor, the first visible light beam being reflected by the alignment sensor and forming a reference beam; and simultaneously, the light source module is configured to emanate a second visible light beam to the first wafer stage, the second visible light beam being reflected by the first wafer stage and forming a measuring beam.

Preferably, in the alignment system, the position acquisition module may further include an optoelectronic system configured to receive the reference beam and produce a reference optoelectronic signal, and the optoelectronic conversion module is further configured to receive the measuring beam and produce a measuring optoelectronic signal.

Preferably, in the alignment system, the relative positional data of the first wafer stage with respect to the alignment sensor may be obtained by subtracting the reference optoelectronic signal from the measuring optoelectronic signal.

Preferably, the alignment system may further include a reflector disposed on the alignment sensor, and the first visible light beam is reflected by the reflector and forms the reference beam.

Preferably, in the alignment system, the signal processing device may include: a light intensity signal acquisition and processing module configured to acquire the optical signal from the alignment sensor, convert the optical signal to a digital electrical signal and output the digital electrical signal; and an alignment and management module, configured to receive and process the optical signal from the alignment sensor and the relative positional data and calculate the position for alignment of the alignment mark on the wafer.

Preferably, in the alignment system, the alignment sensor may be disposed above a center of the first wafer stage.

The dual-wafer-stage system includes: the alignment system as defined above; a projection objective secured on the main frame; and a second wafer stage under the projection objective.

Preferably, in the dual-wafer-stage system, the projection objective may be arranged above a center of the second wafer stage.

Preferably, the second wafer stage may be configured for exposure of a wafer.

Preferably, an alignment process by the alignment system may proceed in parallel with an exposure process on the wafer.

The measurement system includes: a first measurement device including a detection source configured to deliver a measuring signal to a target object and collect a signal from the target object; a second measurement device configured to monitor the detection source and acquire a disturbance signal affecting the accuracy of the signal from the target object; and a signal processing device, configured to receive the signal from the target object and the disturbance signal and correct the former with the latter.

Preferably, in the measurement system, the first measurement device may be implemented as an alignment device, with the detection source as an alignment sensor, the target object as an alignment mark and the measuring signal as an optical signal.

Preferably, in the measurement system, the second measurement device may be implemented as a position acquisition module, with the disturbance signal as a relative positional data of the alignment sensor with respect to the target object.

Preferably, in the measurement system, the position acquisition module may include a reflector disposed on the alignment sensor, by which the relative positional data is acquired.

Preferably, in the measurement system, the position acquisition module may further include a light source module configured to provide visible light beams.

Preferably, in the measurement system, the light source module may be configured to emanate a first visible light beam to the reflector, the first visible light beam is reflected by the reflector and forming a reference beam; and simultaneously, the light source module is configured to emanate a second visible light beam to the target object, the second visible light beam is reflected by the target object and forming a measuring beam.

Preferably, in the measurement system, the position acquisition module may further include an optoelectronic system configured to receive the reference beam and produce a reference optoelectronic signal, and the optoelectronic system is further configured to receive the measuring beam and produce a measuring optoelectronic signal, wherein the relative positional data of the alignment sensor with respect to the target object are obtained based on the reference optoelectronic signal and the measuring optoelectronic signal.

In the alignment system, dual-wafer-stage system and measurement system according to the present invention, the position acquisition module collects positional data both from the wafer stage and from the reflector arranged on the alignment sensor. In other words, it collects both positional data of the alignment sensor and positional data of the wafer stage. In addition, the data can be processed to indicate the relative position of the wafer stage relative to the alignment sensor whose vibration has been zeroed. That is, a position where the alignment mark is aligned can be obtained with the relative vibration amplitude of the alignment sensor being zeroed. This can circumvent the impact of vibration of the alignment sensor and allow higher alignment repeatability.

In these figures, 101-main frame; 102-projection objective; 103-alignment sensor; 104-wafer stage under exposure; 105-wafer stage under measurement; 106-wafer under exposure; 107-wafer under measurement;

201-main frame; 202-alignment sensor; 203-light intensity signal acquisition and processing module; 204-reflector; 205-wafer stage; 206-alignment mark, 207-wafer; 208-position acquisition module; 209-alignment and management module;

301-main frame; 302-alignment sensor; 303-light intensity signal acquisition and processing module; 304-reflector; 305-wafer stage under measurement; 306-alignment mark; 307-wafer; 308-position acquisition module; 309-alignment and management module; 310-projection objective; 311-wafer stage under exposure;

401-alignment sensor; 402-second measurement device; 403-signal processing device; 404-target object; and 405-reflector.

DETAILED DESCRIPTION

Specific embodiments of the present invention will be described in greater detail below with reference to the accompany drawings. Features and advantages of the invention will be more apparent from the following detailed description, and from the appended claims. Note that the figures are provided in a very simplified form not necessarily presented to scale, with the only intention to facilitate convenience and clarity in explaining the embodiments.

Figure 1:
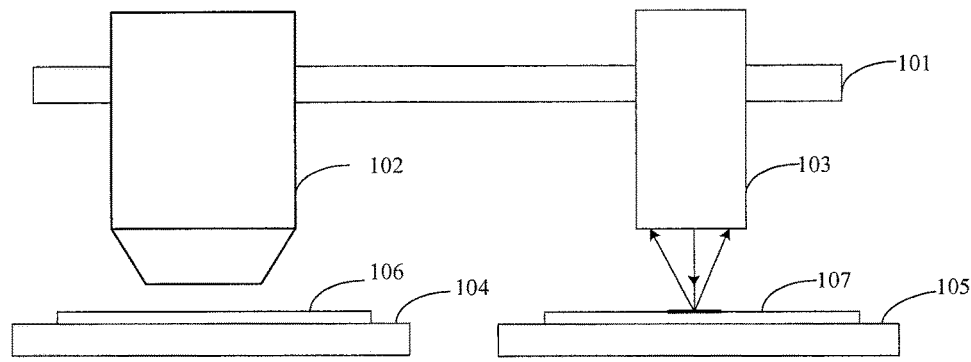
FIG. 1 is a structural schematic of a dual-wafer-stage system of the prior art.
Figure 2:
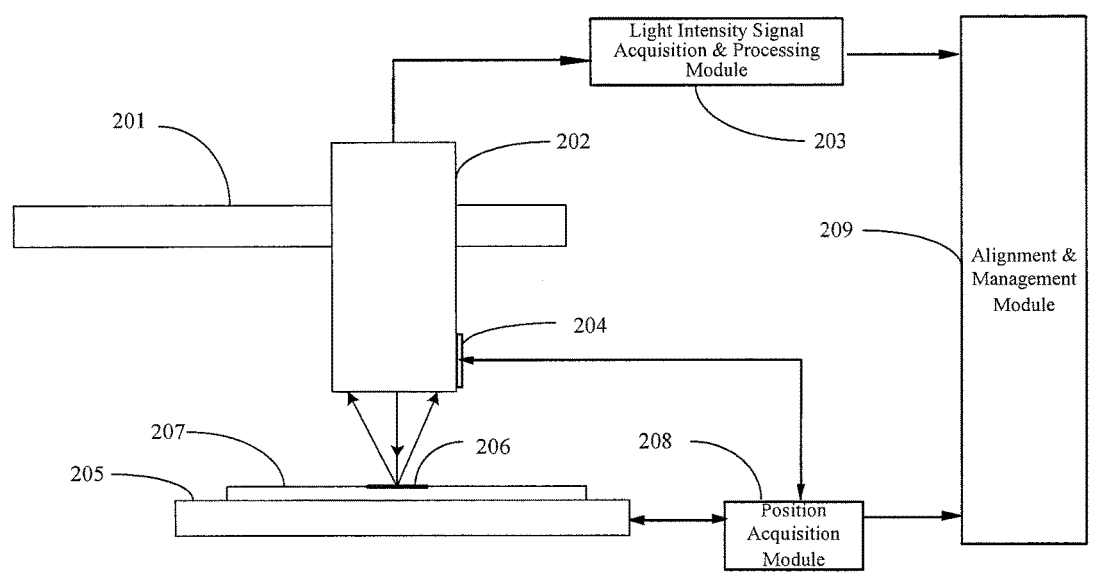
FIG. 2 is a schematic illustration of an alignment system based on relative position measurement according to an embodiment of the present invention.

As shown in FIG. 2, an alignment system based on relative position measurement according to the present invention includes: a main frame 201; an alignment sensor 202, the alignment sensor 202 is attached to the main frame 201; a light intensity signal acquisition and processing module 203, the light intensity signal acquisition and processing module 203 is configured to acquire an optical signal from the alignment sensor 202, convert it to a digital electrical signal and output the digital electrical signal; a reflector 204, the reflector 204 is disposed on the alignment sensor 202; a wafer stage 205, wherein the alignment sensor 202 is arranged above the wafer stage 205 and the wafer stage 205 is configured to carry a wafer 207, the wafer 207 has provided with an alignment mark 206; a position acquisition module 208, the position acquisition module 208 is adapted to acquire positional data of the reflector 204 and the wafer stage 205 and to output the relative positional data between the reflector 204 and the wafer stage 205; and an alignment and management module 209, the alignment and management module 209 is configured to acquire and process the digital light intensity signal and the relative positional data and calculate a position for the alignment mark 206 where it is aligned.

Specifically, the alignment sensor 202 is faced toward a center of the wafer stage 205, the wafer 207 is arranged on the wafer stage 205. An illumination module in the alignment sensor 202 provide ultraviolet (UV) or extreme UV (EUV) light for the alignment, illumination and irradiation of the alignment mark 206 on the wafer 207. The alignment sensor 202 further includes an optoelectronic detector for detecting and collecting reflected and diffracted light beams from the alignment mark 206. The collected reflected and diffracted light beams are processed by the alignment sensor 202 and output thereby as the optical signal.

Figure 3:
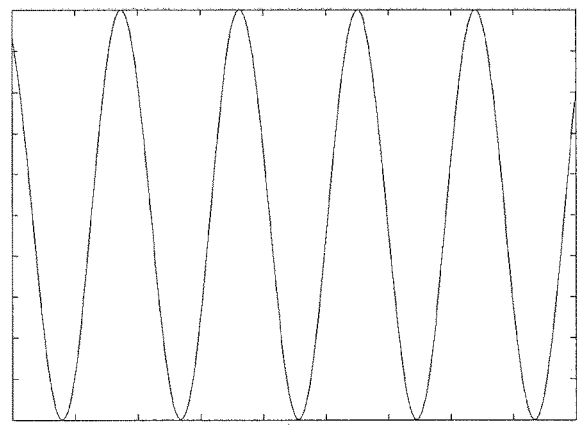
FIG. 3 schematically illustrates the time-dependence of vibration amplitude of an alignment sensor during scanning for alignment by an alignment system based on relative position measurement according to an embodiment of the present invention.

Specifically, in FIG. 3, the horizontal axis represents time and the vertical axis represents the vibration amplitude of the alignment sensor 202. The alignment sensor 202 vibrates inevitably and we only concern its vibration during the scanning for alignment.

As shown in FIG. 2, after the receipt of the optical signal, the light intensity signal acquisition and processing module 203 converts it into the digital electrical signal and transfers the digital electrical signal to the alignment and management module 209.

A light source module in the position acquisition module 208 provides simultaneous visible light beams including: a first visible light; and a second visible light which illuminates to the wafer stage 205 and is reflected as a measuring beam by the wafer stage 205, the measuring beam is received by an optoelectronic system in the position acquisition module 208 and converted thereby into a measuring optoelectronic signal containing positional data $X_{WS}$ of the wafer stage 205 with respect to the vibrating alignment sensor 202.

Figure 4:
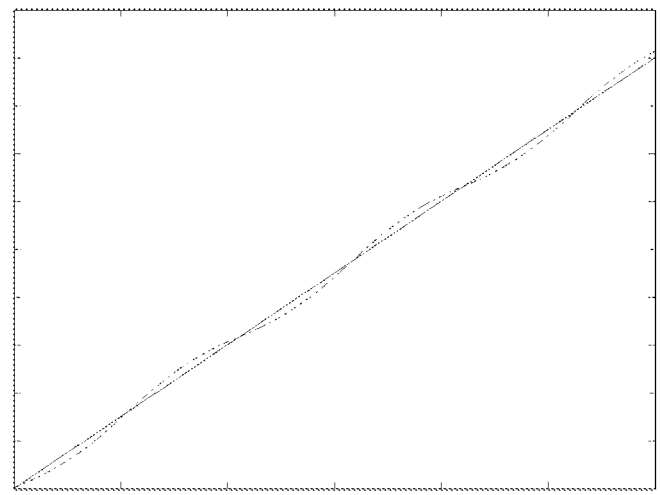
FIG. 4 is a diagram showing a positional relationship between a wafer stage and an alignment sensor during scanning for alignment by an alignment system based on relative position measurement according to an embodiment of the present invention.

Specifically, FIG. 4 shows a positional relationship between the wafer stage 205 and the alignment sensor 202. As the alignment mark 206 is formed on the wafer 207 that is placed on the wafer stage, the figure also illustrates a positional relationship between the alignment mark 206 and the alignment sensor 202. As the wafer stage 205 moves at a constant speed, if the alignment sensor 202 were not vibrating, the position of the wafer stage 205 would change linearly with that of the alignment sensor 202, as indicated by the solid line in FIG. 4. However, as the vibration of the alignment sensor 202 is inevitable, the positional relationship between the wafer stage 205 and the alignment sensor 202 is not linear, as indicated by the dashed curved line in FIG. 4. That is, the wafer stage 205 and the alignment sensor 202 do not move at a constant speed relative to each other.

The first visible light beam illuminates to the reflector 204 on the alignment sensor 202 and is reflected as a reference beam by the reflector 204, the reference beam is collected and processed by the optoelectronic system in the position acquisition module 208 into a reference optoelectronic signal containing positional data $X_{AS}$ of the vibrating alignment sensor 202.

As such, $(X_{WS}-X_{AS})$ represents the position of the wafer stage 205 relative to the alignment sensor 202 after the impact of the vibration of the alignment sensor has been eliminated, the relative position of the wafer stage 205 to the alignment sensor whose vibration amplitude has been zeroed.

This relative position, i.e., $(X_{WS}-X_{AS})$ is transferred to the alignment and management module 209 by the position acquisition module 208. Based on the digital electrical signal and the relative position $(X_{WS}-X_{AS})$, the alignment and management module 209 outputs the position for the alignment of the alignment mark 206 on the wafer 207.

During the scanning for alignment, the alignment and management module 209 calculates the position for the alignment of the alignment mark based on the digital light intensity signal and the relative position $(X_{WS}-X_{AS})$ and raises an alignment control signal.

Figure 5:
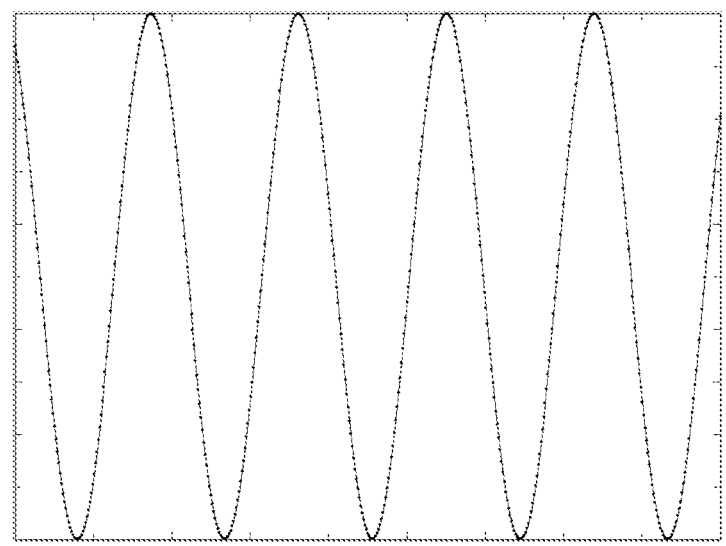
FIG. 5 is a diagram showing a relationship between light intensity and the position of a wafer stage relative to an alignment sensor during scanning for alignment by an alignment system based on relative position measurement according to an embodiment of the present invention.

In FIG. 5, the horizontal axis represents the position of the wafer stage 205 relative to the alignment sensor 202, and the vertical axis represents the light intensity Through real-time detection of the vibration of the alignment sensor 202, the positional data acquired by the position acquisition module 208 reflect the relative position of the wafer stage 205 to the alignment sensor 202 whose vibration amplitude has been zeroed. Therefore, no matter how the alignment sensor vibrates, vibration amplitude of the alignment sensor 202 with respect to the wafer stage 205 will always be zero, leading to increased repeatability accuracy of alignment and increased alignment measurement repeatability.

Figure 6:
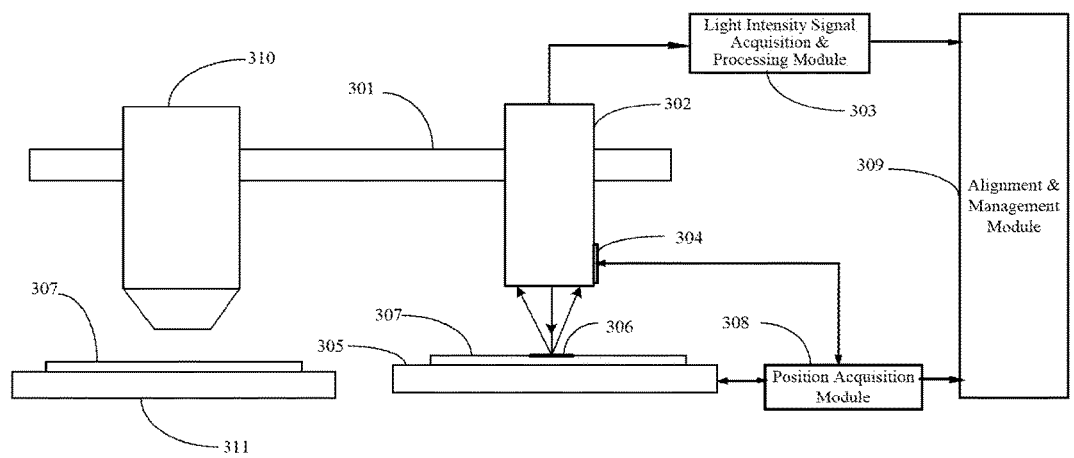
FIG. 6 is a schematic illustration of a dual-wafer-stage system according to an embodiment of the present invention.

As shown in FIG. 6, the present invention also provides a dual-wafer-stage system including: an alignment system based on relative position measurement as defined above (with the reference numerals of their elements being modified to be initialized with "3" instead of "2"); a projection objective 310 secured on the main frame 301; a wafer stage 311 under exposure corresponding to the projection objective 310.

Specifically, the alignment system based on relative position measurement as defined above includes: a main frame 301; an alignment sensor 302, the alignment sensor 302 is attached to the main frame 301; a light intensity signal acquisition and processing module 303, the light intensity signal acquisition and processing module 303 is configured to acquire an optical signal from the alignment sensor 302, convert it to a digital electrical signal and output the digital electrical signal; a reflector 304, the reflector 304 is disposed on the alignment sensor 302; a wafer stage 305 under measurement, the alignment sensor 302 is arranged above the wafer stage 305 and the wafer stage 305 is configured to carry a wafer 307, wherein the wafer 307 has provided with an alignment mark 306; a position acquisition module 308, the position acquisition module 308 is adapted to acquire positional data of the reflector 304 and the wafer stage 305 and to output the relative positional data between the reflector 304 and the wafer stage 305; and an alignment and management module 309, the alignment and management module 309 is configured to acquire and process the digital light intensity signal and the relative positional data and calculate a position for the alignment mark 306 where it is aligned.

Specifically, the projection objective 310 is disposed right above a center of the wafer stage 311 under exposure. The wafer stage 305 is configured for measurement of the wafer 307, including measurements for alignment, leveling and focusing, etc., and the wafer stage 311 is adapted primarily for exposure of line features. They work in parallel and interchangeably, which can lead to an improvement in throughput.

Figure 7:
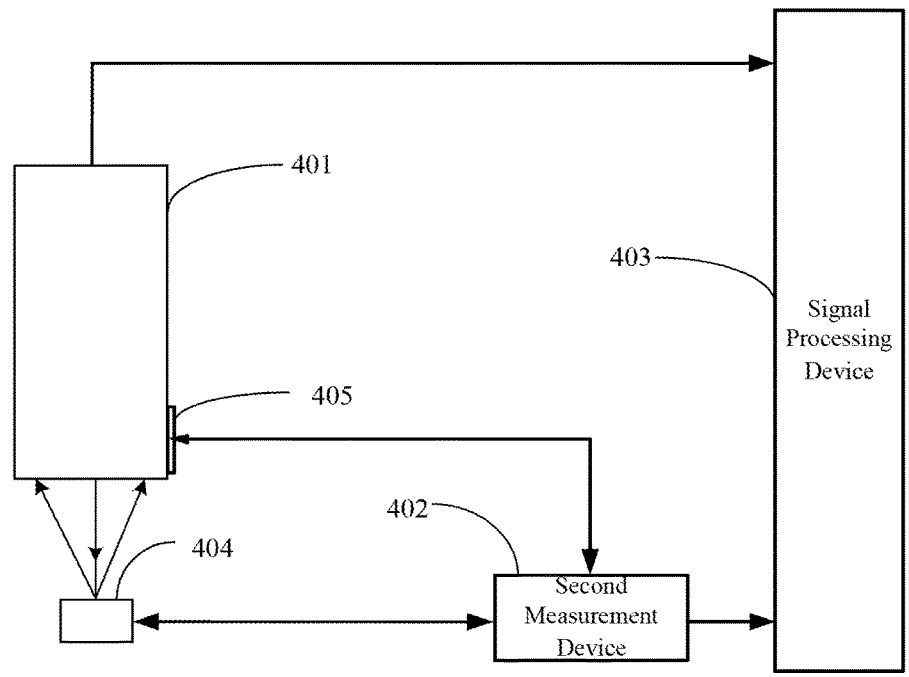
FIG. 7 is a schematic illustration of a measurement system according to an embodiment of the present invention.

As shown in FIG. 7, the present invention also provides a measurement system including a first measurement device configured as an alignment device including a detection source configured to deliver a measuring signal to a target object and to collect a detection signal from the target object. Specifically, the detection source may be implemented as an alignment sensor 401 in a built-in illumination module, with the target object 404 as an alignment mark and the measuring signal as an optical signal. The alignment sensor 401 includes an optoelectronic detector for detecting and collecting reflected and diffracted light beams from the alignment mark and processing them into the optical signal, i.e., the measuring signal.

The measurement system further includes a second measurement device 402, the second measurement device 402 is adapted to monitor the detection source and acquire a disturbance signal affecting the accuracy of the detection signal from the target object.

Specifically, the second measurement device 402 may be implemented as a position acquisition module, with the disturbance signal as relative positional data of the alignment sensor 401 and the target object 404. The position acquisition module includes a reflector 405 disposed on the alignment sensor 401, wherein the relative positional data are obtained by means of the reflector 405.

Additionally, the position acquisition module may include a light source module capable of emanating visible light. A first visible light beam from the light source module illuminates the reflector 405 and is reflected as a reference beam by the reflector 405. Simultaneously, a second visible light beam from the light source module is directed to the target object 405 and is reflected as a measuring beam by the reflector.

The position acquisition module may further include an optoelectronic conversion module which receives the reference beam and, base thereon, produces a reference optoelectronic signal containing positional data $X_{AS}$ of the vibrating alignment sensor 401.

In addition, the optoelectronic conversion module receives the measuring beam and, base thereon, generates a measuring optoelectronic signal containing positional data $X_{WS}$ of the target object 405 with respect to the vibrating alignment sensor 401.

Based on the reference optoelectronic signal and the measuring optoelectronic signal, the relative positional data of the alignment sensor and the target object, i.e., the disturbance signal ($X_{WS}-X_{AS}$) affecting the accuracy of the detection signal from the target object can be obtained.

The measurement system may further include a signal processing device 403 configured to receive the detection signal from the target object and the disturbance signal and to correct the detection signal based on the disturbance signal.

In summary, in the alignment system, dual-wafer-stage system and measurement system according to the present invention, which are based on relative position measurement, the position acquisition module collects positional data both from the wafer stage and from the reflector arranged on the alignment sensor. In other words, it collects both positional data of the alignment sensor and positional data of the wafer stage. In addition, the data can be processed to indicate the relative position of the wafer stage relative to the alignment sensor whose vibration has been zeroed. That is, a position where the alignment mark is aligned can be obtained with the relative vibration amplitude of the alignment sensor being zeroed. This can circumvent the impact of vibration of the alignment sensor and allow higher alignment repeatability.

The preferred embodiments presented above are merely examples and are in no way meant to limit the present invention. Any changes such as equivalent alternatives or modifications made by those skilled in the art to the subject matter or features thereof disclosed herein without departing from the teachings of the present invention are considered to fall within the scope of the invention.

What is claimed is:

1. An alignment system, comprising:
a main frame;
a first wafer stage configured to carry a wafer, the wafer comprising an alignment mark;
an alignment sensor attached to the main frame and arranged above the alignment mark, the alignment sensor being configured to output an optical signal;
a position acquisition module, configured to collect a relative positional data of the first wafer stage with respect to the alignment sensor and output the relative positional data of the first wafer stage; and
a signal processing device, configured to receive and process the optical signal from the alignment sensor and the relative positional data and to calculate a position for alignment of the alignment mark of the wafer,
wherein the position acquisition module comprises a light source module configured to provide visible light beams, wherein the light source module is configured to emanate a first visible light beam to the alignment sensor, the first visible light beam being reflected by the alignment sensor and forming a reference beam; and simultaneously, the light source module is configured to emanate a second visible light beam to the first wafer stage, the second visible light beam being reflected by the first wafer stage and forming a measuring beam.

2. The alignment system of claim 1, wherein the alignment sensor comprises an illumination module configured to provide an ultraviolet light or an extreme ultraviolet light for illuminating the alignment mark for alignment.

3. The alignment system of claim 2, wherein the alignment sensor further comprises an optoelectronic detector configured to detect and receive reflected and diffracted light beams from the alignment mark and output the optical signal.

4. The alignment system of claim 1, wherein the position acquisition module further comprises an optoelectronic system configured to receive the reference beam and produce a reference optoelectronic signal, and the optoelectronic system is further configured to receive the measuring beam and produce a measuring optoelectronic signal.

5. The alignment system of claim 4, wherein the relative positional data of the first wafer stage with respect to the alignment sensor is obtained by subtracting the reference optoelectronic signal from the measuring optoelectronic signal.

6. The alignment system of claim 1, further comprising a reflector arranged on the alignment sensor, and wherein the first visible light beam is reflected by the reflector and forms the reference beam.

7. The alignment system of claim 1, wherein the signal processing device comprises:
  a light intensity signal acquisition and processing module configured to acquire the optical signal from the alignment sensor, convert the optical signal to a digital electrical signal and output the digital electrical signal; and
  an alignment and management module, configured to receive and process the optical signal from the alignment sensor and the relative positional data and calculate the position for alignment of the alignment mark on the wafer.

8. The alignment system of claim 1, wherein the alignment sensor is arranged above a center of the first wafer stage.

9. A dual-wafer-stage system, comprising: the alignment system as defined in claim 1; a projection objective secured on the main frame; and a second wafer stage under the projection objective.

10. The dual-wafer-stage system of claim 9, wherein the projection objective is arranged above a center of the second wafer stage.

11. The dual-wafer-stage system of claim 9, wherein the second wafer stage is configured for exposure of a wafer.

12. The dual-wafer-stage system of claim 11, wherein an alignment process by the alignment system proceeds in parallel with an exposure process on the wafer.

13. A measurement system, comprising:
  a first measurement device comprising a detection source configured to deliver a measuring signal to a target object and acquire a detection signal;
  a second measurement device configured to monitor the detection source and acquire a disturbance signal affecting an accuracy of the detection signal; and
  a signal processing device, configured to receive the detection signal and the disturbance signal and correct the detection signal based on the disturbance signal, wherein the position acquisition module comprises a light source module configured to provide visible light beams, wherein the light source module is configured to emanate a first visible light beam to the reflector, the first visible light beam being reflected by the reflector and forming a reference beam; and simultaneously, the light source module is configured to emanate a second visible light beam to the target object, the second visible light beam being reflected by the target object and forming a measuring beam.

14. The measurement system of claim 13, wherein: the first measurement device is implemented as an alignment device, the detection source is implemented as an alignment sensor, the target object is implemented as an alignment mark and the measuring signal is implemented as an optical signal.

15. The measurement system of claim 14, wherein the second measurement device is implemented as a position acquisition module, and wherein the disturbance signal is implemented as a relative positional data of the alignment sensor with respect to the target object.

16. The measurement system of claim 15, wherein the position acquisition module comprises a reflector arranged on the alignment sensor, and wherein the relative positional data is acquired by the reflector.

17. The measurement system of claim 13, wherein the position acquisition module further comprises an optoelectronic system configured to receive the reference beam and produce a reference optoelectronic signal, and the optoelectronic system is further configured to receive the measuring beam and produce a measuring optoelectronic signal, and wherein the relative positional data of the alignment sensor with respect to the target object are obtained based on the reference optoelectronic signal and the measuring optoelectronic signal.

* * * * *